United States Patent
Ehama et al.

(10) Patent No.: US 11,561,883 B2
(45) Date of Patent: Jan. 24, 2023

(54) PIPELINED MICRO CONTROLLER UNIT

(71) Applicant: SanDisk Technologies LLC, Addison, TX (US)

(72) Inventors: Masakazu Ehama, Sagamihara (JP); Hiroyuki Mizukoshi, Kawasaki (JP); Yan Li, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 262 days.

(21) Appl. No.: 16/712,593

(22) Filed: Dec. 12, 2019

(65) Prior Publication Data

US 2021/0182178 A1 Jun. 17, 2021

(51) Int. Cl.
| | | |
|---|---|---|
| *G06F 11/36* | (2006.01) | |
| *G11C 16/30* | (2006.01) | |
| *G06F 9/26* | (2006.01) | |
| *G06F 9/24* | (2006.01) | |
| *G06F 9/22* | (2006.01) | |

(52) U.S. Cl.
CPC .......... *G06F 11/3648* (2013.01); *G06F 9/226* (2013.01); *G06F 9/24* (2013.01); *G06F 9/261* (2013.01); *G11C 16/30* (2013.01)

(58) Field of Classification Search
CPC ........ G06F 11/3648; G06F 9/226; G06F 9/24; G06F 9/261; G06F 11/362; G11C 16/30; G11C 16/0483
See application file for complete search history.

(56) References Cited

U.S. PATENT DOCUMENTS

| | | | | |
|---|---|---|---|---|
| 6,262,567 B1 * | 7/2001 | Bartlett | ................... | G05F 1/465 |
| | | | | 323/283 |
| 10,511,312 B1 * | 12/2019 | Pastorello | ............... | H03L 7/081 |
| 10,573,397 B1 * | 2/2020 | Sehgal | ................ | G11C 11/5628 |
| 2004/0046681 A1 * | 3/2004 | Frulio | ..................... | G11C 5/145 |
| | | | | 341/144 |
| 2004/0049628 A1 * | 3/2004 | Lin | ....................... | G06F 9/4843 |
| | | | | 711/202 |
| 2006/0023476 A1 * | 2/2006 | Fosler | ............... | H02M 3/33515 |
| | | | | 363/49 |
| 2008/0037301 A1 * | 2/2008 | Fontana | ................. | G11C 5/147 |
| | | | | 363/59 |
| 2008/0094138 A1 * | 4/2008 | Fulga | .................. | H03G 3/3047 |
| | | | | 330/140 |
| 2009/0055005 A1 * | 2/2009 | Oxman | .................. | G10L 19/16 |
| | | | | 712/36 |
| 2009/0070615 A1 * | 3/2009 | Maggiolino | ............ | H04L 12/10 |
| | | | | 713/340 |
| 2011/0107016 A1 * | 5/2011 | Kim | .................... | G06F 12/0246 |
| | | | | 711/E12.008 |

(Continued)

FOREIGN PATENT DOCUMENTS

WO WO-9617298 A1 * 6/1996 .......... G06F 9/5016

*Primary Examiner* — Farley Abad
(74) *Attorney, Agent, or Firm* — Dickinson Wright PLLC; Steven C. Hurles

(57) ABSTRACT

A 3D NAND memory device is provided in which control is performed by two microcontroller units (MCU). During manufacture of the memory device, bug fixes required for the controller may be addressed using a software solution by which an instruction requiring correction in one of the two MCUs is replaced with a corrected instruction stored in a RAM.

11 Claims, 4 Drawing Sheets

(56) References Cited

U.S. PATENT DOCUMENTS

| | | | | |
|---|---|---|---|---|
| 2014/0077892 A1* | 3/2014 | Trotta | ................. | G05F 1/46 |
| | | | | 331/186 |
| 2014/0232362 A1* | 8/2014 | Lee | ................. | H02M 3/155 |
| | | | | 323/271 |
| 2015/0054575 A1* | 2/2015 | Bulzacchelli | ............ | G05F 1/10 |
| | | | | 327/540 |
| 2018/0102704 A1* | 4/2018 | Achter | ................. | H02M 3/07 |

\* cited by examiner

PIPELINED MICRO CONTROLLER UNIT

TECHNICAL FIELD

Apparatuses and methods consistent with example embodiments relate to control of a three-dimensional (3D) Not-AND (NAND) flash memory using two microcontroller units (MCU), for which bug fixes in manufacturing are addressed using a software solution.

DESCRIPTION OF THE RELATED ART

3D NAND flash memory is a type of non-volatile flash memory in which memory cells are stacked vertically in multiple layers. 3D NAND was developed to address challenges encountered in scaling two-dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an example 3D NAND memory array. In this example, the memory array is a 3D NAND memory array. However, this is just one example of a memory array. The memory array includes multiple physical layers that are monolithically formed above a substrate, such as a silicon substrate.

Storage elements, for example memory cells 1001, are arranged in arrays in the physical layers. A memory cell 1001 includes a charge trap structure between a word line 1050 and a conductive channel 1042. Charge can be injected into or drained from the charge trap structure via biasing of the conductive channel 1042 relative to the word line 1050. For example, the charge trap structure can include silicon nitride and can be separated from the word line 1050 and the conductive channel 1042 by a gate dielectric, such as a silicon oxide. An amount of charge in the charge trap structure affects an amount of current through the conductive channel 1042 during a read operation of the memory cell 1001 and indicates one or more bit values that are stored in the memory cell 1001.

The 3D memory array includes multiple blocks. Each block includes a "vertical slice" of the physical layers that includes a stack of word lines 1050. Multiple conductive channels 1042 (having a substantially vertical orientation, as shown in FIG. 1) extend through the stack of word lines 1050. Each conductive channel 1042 is coupled to a storage element in each word line 1050, forming a NAND string of storage elements, extending along the conductive channel 1042. FIG. 1 illustrates three blocks, five word lines 1050 in each block, and three conductive channels 1042 in each block for clarity of illustration. However, the 3D memory array can have more than three blocks, more than five word lines per block, and more than three conductive channels per block.

Physical block circuitry is coupled to the conductive channels 1042 via multiple conductive lines: bit lines, illustrated as a first bit line BL0, a second bit line BL1, and a third bit line BL2 at a first end of the conductive channels (e.g., an end most remote from the substrate) and source lines, illustrated as a first source line SL0, a second source line SL1, and a third source line SL2, at a second end of the conductive channels (e.g., an end nearer to or within the substrate). The physical block circuitry is illustrated as coupled to the bit lines BL0-BL2 via "P" control lines, coupled to the source lines SL0-SL2 via "M" control lines, and coupled to the word lines 1050 via "N" control lines. Each of P, M, and N can have a positive integer value based on the specific configuration of the 3D memory array.

Each of the conductive channels 1042 is coupled, at a first end to a bit line BL, and at a second end to a source line SL. Accordingly, a group of conductive channels 1042 can be coupled in series to a particular bit line BL and to different source lines SL.

It is noted that although each conductive channel 1042 is illustrated as a single conductive channel, each of the conductive channels 1042 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

Among other things, the physical block circuitry facilitates and/or effectuates read and write operations performed on the 3D memory array. For example, data can be stored to storage elements coupled to a word line 1050 and the circuitry can read bit values from the memory cells 1001.

FIG. 2 is a schematic diagram illustrating an example of a memory device 100. The memory device 100 includes a memory array 126 of memory cells, such as a two-dimensional array of memory cells or a three-dimensional array of memory cells. The memory array 126 may include memory cells according to a NAND flash type architecture or a NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. The memory array 126 may also be other types of memory cells programmable to store multiple bits of data per cell as non-volatile memory or volatile memory and may be other types of memory cells in other configurations besides NAND or NOR configurations. The memory device 100 may include multiple dies of memory arrays 126.

The memory array 126 is addressable by word lines via a row decoder 124 and by bit lines via a column decoder 132. The row decoder 124 selects one or more word lines and the column decoder 132 selects one or more bit lines in order to apply appropriate voltages to the respective gates/drains of the addressed memory transistor.

The read/write circuits 128 are provided to read or write (program) the memory states of addressed memory transistors. The read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with the read/write circuits 128 to perform memory operations on the memory array 126. Control circuitry 110 may include drivers for word lines, source side select lines (SGS), drain side select lines (SGD), and source lines. Control circuitry 110 is also in communication with source control circuits 127, which include source line driver circuits used to drive various voltages on the individual source lines.

The memory device 100 includes a controller 122 which operates with a host 80 through a link 120. Commands and data are transferred between the host and the controller 122 via the link 120. The link 120 may include a connection (e.g., a communication path), such as a bus or a wireless connection.

The memory device 100 may be used as storage memory, a main memory, a cache memory, a backup memory, or a redundant memory. The memory device 100 may be an internal storage drive, such as a notebook hard drive or a desktop hard drive. The memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. The memory device 100 may take the form of an embedded mass storage device, such as an eSD/eMMC embedded flash drive, embedded in host 80. The memory device 100 may also be any other type of internal storage device, removable storage device, embedded storage device, external storage device, or network storage device, as would be understood by one of skill in the art.

The memory device 100 may be directly coupled to the host 80 or may be indirectly coupled to the host 80 via a network. For example, the network may include a data center storage system network, an enterprise storage system network, a storage area network, a cloud storage network, a local area network (LAN), a wide area network (WAN), the Internet, and/or another network.

Instructions may be executed by any of various components of memory device 100, such as by the controller circuitry 110, the row decoder 124, the column decoder 132, read/write circuits 128, source control circuits 127, logic gates, switches, latches, application specific integrated circuits (ASICs), programmable logic controllers, embedded microcontrollers, and other components of memory device 100.

Regarding the actual architecture of flash memory, there are two primary circuit components—the memory array itself and the logic circuitry. The logic circuitry, including, for example, the controller circuitry 110, is required for the chip to function correctly. However, it requires physical space which reduces the number of gigabytes of data that can be stored within a given chip area. The process used to fabricate the logic circuitry is Complementary Metal Oxide Semiconductor (CMOS).

SUMMARY

Example embodiments may address at least the above problems and/or disadvantages and other disadvantages not described above. Also, example embodiments are not required to overcome the disadvantages described above, and may not overcome any of the problems described above.

According to an aspect of an example embodiment, a memory device comprises a memory array and a controller comprising a first MCU comprising a microcontroller and firmware stored thereon which, when executed by the microcontroller causes the MCU to execute a first method comprising loading a plurality of parameters for a digital analog converter (DAC) computation; and a second MCU comprising a microcontroller and firmware stored thereon which, when executed by the microcontroller causes the second MCU to execute a second method comprising executing the DAC computation.

The first MCU may also receive a command and an address from an external device, receive an instruction from a read-only memory (ROM), and execute the instruction received from the ROM.

One of the first MCU and the second MCU may generate conditions using the parameters loaded by the first MCU.

The first MCU may generate the conditions and transmit the conditions and parameters to a load register.

The second MCU may obtain data from the load register and adding the data to a temporary register.

The second MCU may transfer a DAC value comprising a result of the DAC computation, to a plurality of charge pumps and voltage regulators.

The memory device may be a 3D NAND device.

According to an aspect of another example embodiment, an engineering change order (ECO) method comprises determining an address of a current instruction in a ROM; generating a match signal indicating a software ECO address in a RAM, based on the address of the current instruction in the ROM; and selecting execution of a corrected instruction stored at the software ECO address in the RAM in place of execution of the current instruction stored in the ROM.

The generating may comprise a content addressable memory (CAM) receiving an input indicating an address of a current instruction in an MCU, and the CAM generating a match signal indicating a software ECO address;

The selecting may comprises the CAM outputting the match signal and the address of the current instruction in the MCU, and a first RAM receiving the match signal and the address of the current instruction and outputting the software ECO address to a program counter.

The selecting may comprise the CAM outputting the match signal and the address of the current instruction in the MCU, and a first RAM receiving the match signal and the address of the current instruction and outputting the software ECO address to a program counter.

The MCU may be a controller of a 3D NAND memory device.

According to an aspect of another example embodiment, a control method of a memory device comprises a first microcontroller loading a plurality of parameters for a DAC computation, and a second microcontroller executing the DAC computation.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
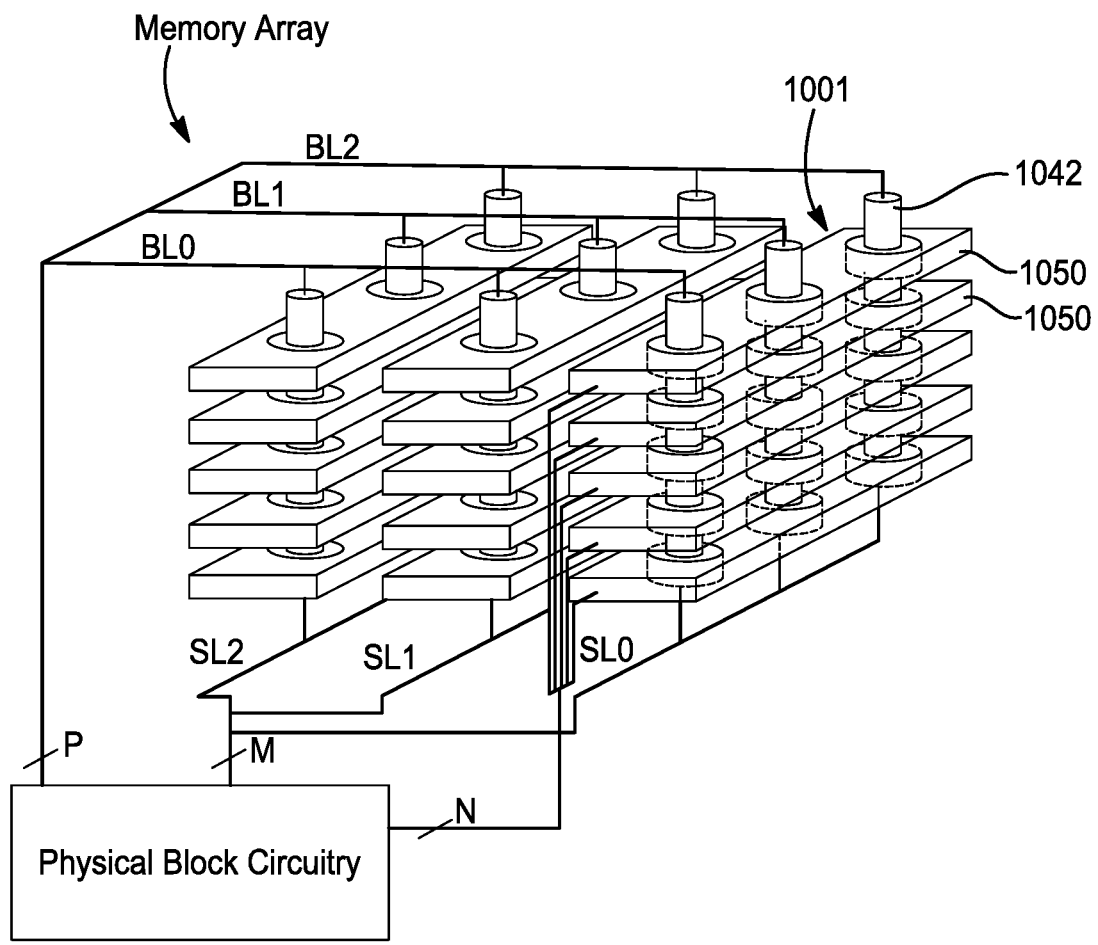
FIG. 1 is a diagram of an example 3D NAND memory array.
Figure 2:
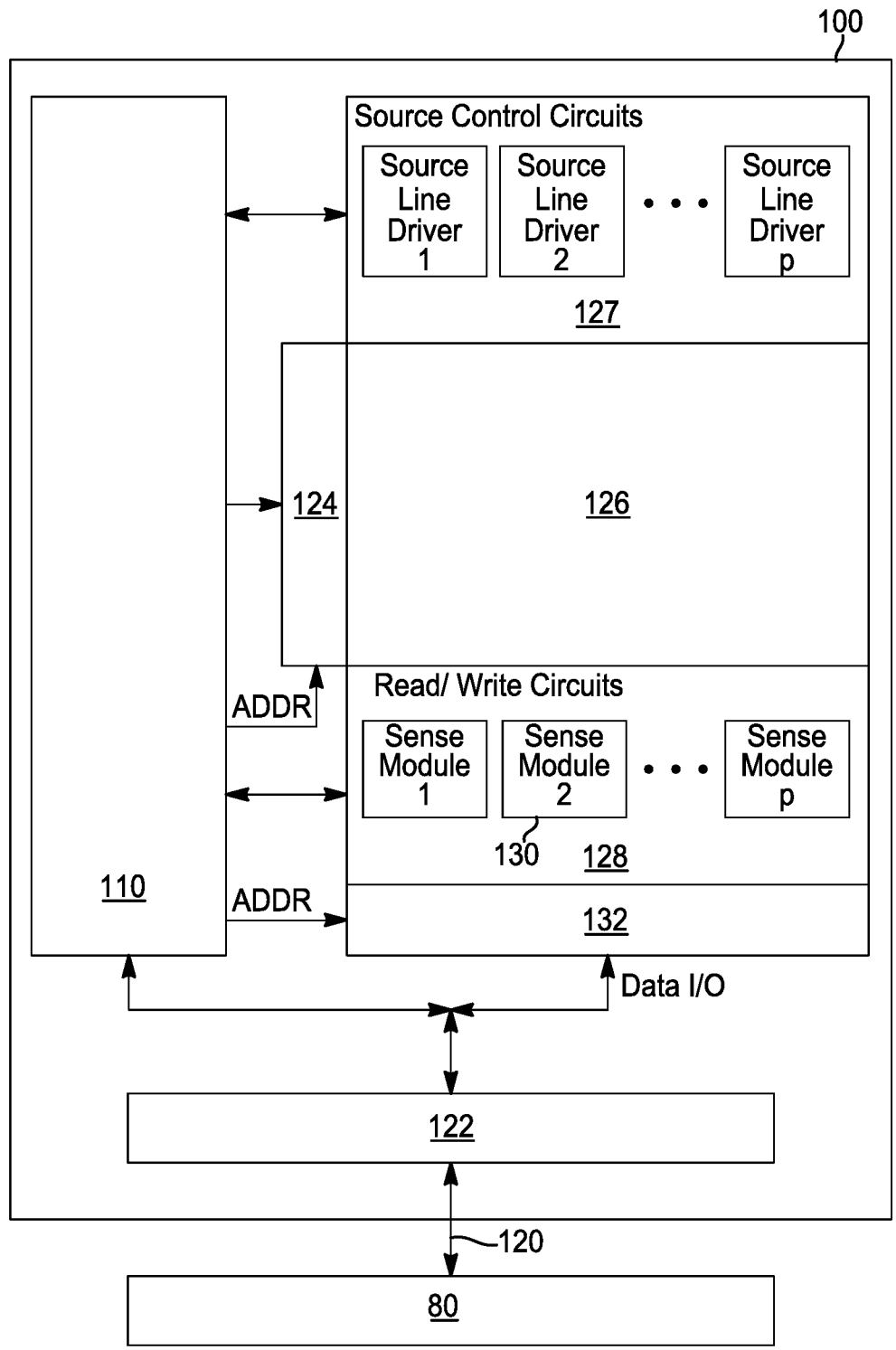
FIG. 2 is a schematic diagram illustrating an example of a memory device.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

One reason that CuA architecture dies are time consuming to produce is that hard-wired logic is used. This means that when issues are discovered in the logic, an Engineering Change Order (ECO) is needed, which requires a time-consuming process of mask refinement. This hardwired logic of the control circuitry 110 includes a digital-analog converter (DAC) controller which controls the DACs required by the memory device, as well as a voltage controller which controls the voltage regulators required by the memory device.

One or more example embodiments described herein may alleviate this problem by performing digital analog conversion (DAC) control with two micro controller units (MCU). In a related art system, DAC control is performed by hard-wired logic. According to one or more example embodiments, the two MCUs include a first MCU that controls data loading and logic operators, and a second MCU which does not perform data loading. For data transfer from one MCU to the other, a load register is used. The necessary logic is provided by firmware. Therefore, if a bug fix or improvement is required, the firmware code can be changed without the need of any ECOs.

Additionally, if the NAND performance doesn't meet specifications after a modification is made, the supply voltage may need to be changed in order to improve the performance. This is particularly true when the diameter of a memory hole may vary from a top layer to a bottom layer. However, with related art hard-wired logic, the supply voltage cannot be changed after tape-out—the point at which the graphic for the photomask of the circuit is sent to the fabrication facility. In contrast, according to one or more example embodiments described herein, using the dual MCU structure, one can test the supply voltage on actual silicon because the firmware code can be changed.

Figure 3:
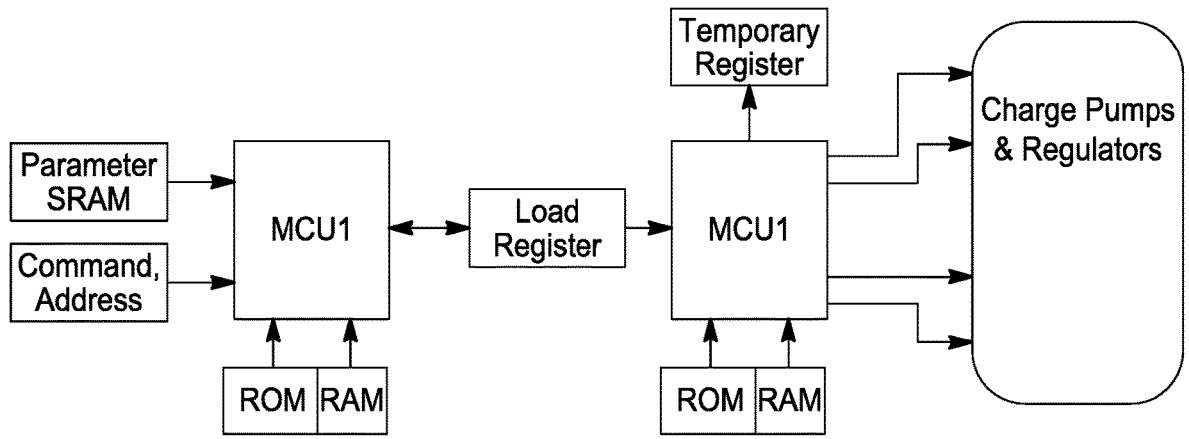
FIG. 3 is a block diagram of a first MCU1 and a second MCU2 according to an example embodiment.

FIG. 3 is a block diagram of a first MCU1 and a second MCU2 according to an example embodiment. The first MCU1 receives a command and an address from a device outside the NAND, such as a host controller (not shown). When the command and address are received, the start address of the instruction in ROM is defined based on the command. Then, the first MCU1 receives instructions from the ROM and executes them.

The MCU1 also receives parameters used for DAC computation, from external memory or registers, for example a parameter SRAM. The parameters are stored in a load register for transfer to the second MCU2. The MCU1 may also use the parameters to generate conditions for DAC computation. Alternately, the generation of conditions using the parameters may be performed by the MCU2.

The MCU2 is started when the command and address are issued. The start address of the instructions in ROM is defined based on the command, just as it is for the first MCU1. The second MCU2 waits until the conditions and parameters are ready in the load register. The second MCU2 may be programmed to obtain the data from the load register and add it to the temporary register. After the second MCU2 loads the conditions and parameters, the MCU2 computes the DAC values and stores an intermediate result into the temporary register. The load register is only for Read, but the temporary register can be used for Read and Write. When the computation is completed, the MCU2 transfers the DAC value to the charge pumps and the voltage regulators.

As noted above, the first MCU1 and the second MCU2 are not identical. The first MCU1 includes a data load unit to obtain the data from the parameters, and also includes a portion of the logic operation unit. However, the MCU1 doesn't include any arithmetic unit such as an adder or multiplier. The second MCU2 includes an arithmetic logic unit for DAC computation, but does not include a data load unit. While the first MCU1 performs data load, and the second MCU2 performs DAC computation, both MCUs perform condition generation, and the operations involved in the condition generation are divided by the firmware code in advance. If, for example, the first MCU1 is too busy to load the parameters, the MCU2 executes the condition generation and DAC computation. On the other hand, if the MCU2 is too busy to compute the DAC value, the MCU1 generates the condition generation for the MCU2. The MCU1 and MCU2 have independent instruction memory as ROM, and thus, each can work according to their own firmware code independently.

Figure 4:
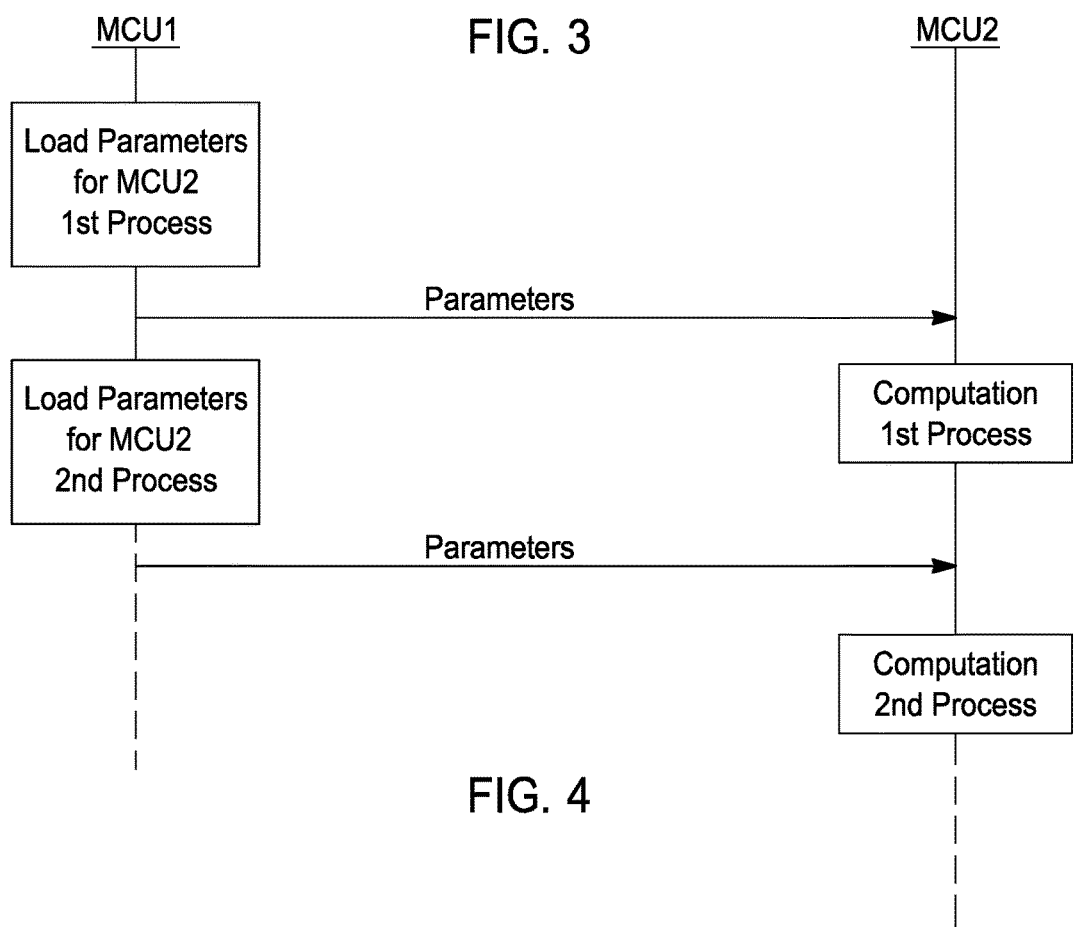
FIG. 4 illustrates parallel operations of the MCU1 and MCU2, according to an example embodiment.

FIG. 4 illustrates parallel operations of the MCU1 and MCU2, according to an example embodiment. As shown, the first MCU1 initially loads the parameters for the second MCU2 for a first process. When the MCU1 has loaded the parameters for the first process, the second MCU2 performs its computations based on the parameters loaded by the first MCU1. After the first MCU1 has loaded the parameters for the first process, while the MCU2 is performing computations for the first process, the first MCU1 then loads the parameters for the second MCU2 for a second process. The MCU2 can only begin computations for the second process once the first MCU1 has loaded the relevant parameters. If the second MCU has completed the computations for the first process, if the first MCU1 has not completed the loading of the parameters for the second process, the second MCU2 must stop.

The loading of parameters and performing of computations for each process is different. For example, the process changes based in a different input address. A word line #0, which is in the bottom layer, may apply a different voltage because of a diameter of the memory hole than a word line in a different layer. Thus, the MCU2 may perform a different computation routine.

As discussed above, the firmware code is stored in ROM, so it cannot be changed after tape-out. In order to change the firmware code, a content addressable memory (CAM) and one or more read only memory (RAM) are prepared. During a power-on read (POR), software Engineering change order (ECO) information is loaded from the NAND array. The CAM compares the program counter of the MCU and generates a match signal. If the CAM outputs the match signal, the MCU gets the ECO address which indicates a firmware address in ECO RAM. ECO RAM has a fixed code, so the MCU executes them based on the ECO address.

Figure 5:
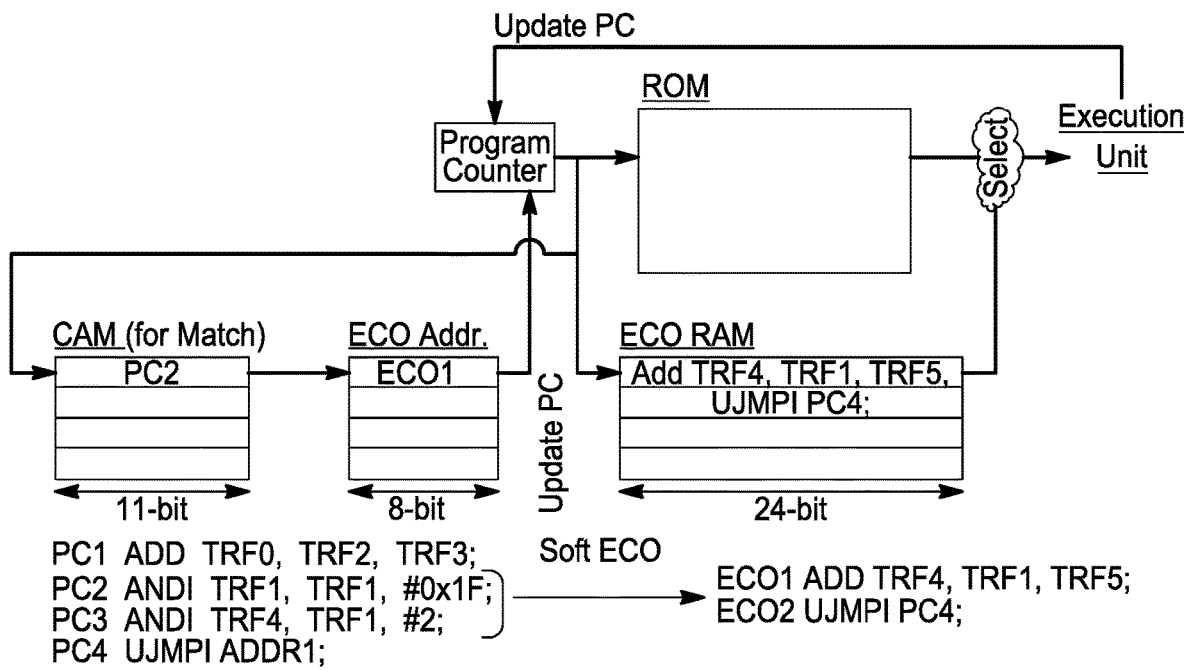
FIG. 5 illustrates an example of software ECO, according to an example embodiment.

FIG. 5 illustrates an example of software ECO, according to an example embodiment. In other words, FIG. 5 illustrates how the firmware of one of the MCUs is replaced for a bug fix. PC1 through PC4 are stored in ROM. By using the CAM and two SRAMs—here, the ECO Addr and ECO RAM—the bugs in the ROM can be fixed. The ECO Addr and ECO RAM include the instructions for the bug fix. In this example, an MCU processes from PC1 through PC4, and there is an issue with PC2 and PC3 in the firmware. The CAM receives an input from the program counter which indicates the address of the current instruction in the ROM. The CAM contains a soft ECO address. For example, if the program counter indicates PC2, the CAM outputs a match signal and the PC2 address in the CAM. For example, the PC2 is stored in address 0 in the CAM, so the CAM outputs address 0 to the ECO Addr RAM.

The ECO Addr RAM receives the match signal and the address from the CAM, it outputs "ECO1," which is the address of the soft ECO code in the ECO Addr RAM, to the program counter. The program counter then uses the new address for the ECO RAM rather than the old address for the ROM. Based on the address for the ECO Addr RAM, the program counter outputs the instruction. Both the ROM and the ECO RAM may output the instruction, but one of the instructions is selected. "UJMPI PC4" indicates the ROM address that the PC returns to after the PC2 and CP3 have been fixed. In this case, PC4 is the subsequent code after the ECO RAM.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A memory device comprising:
a memory array; and
a controller comprising:
a first microcontroller unit (MCU) comprising a microcontroller and firmware stored thereon which, when executed by the microcontroller causes the MCU to execute a first method comprising generating a plurality of digital analog converter (DAC) computation parameters and storing the DAC computation parameters in a load register; and
a second MCU comprising a microcontroller and firmware stored thereon which, when executed by the microcontroller causes the second MCU to execute a second method comprising receiving the plurality of DAC computation parameters from the load register and executing a DAC computation to generate a DAC value and transmitting the DAC value to a plurality of charge pumps and voltage regulators.

2. The memory device of claim 1, wherein the first method further comprises:
receiving a command and an address from an external device,
receiving an instruction from a read-only memory (ROM), and
executing the instruction received from the ROM.

3. The memory device of claim 1, wherein at least one of the first method and the second method further comprises generating conditions using the DAC computation parameters loaded by the first MCU.

4. The memory device of claim 1, wherein the memory device comprises a three-dimensional (3D) Not-And (NAND) memory device.

5. The memory device according to claim 1 wherein the firmware of the first MCU can be changed.

6. The memory device according to claim 5 wherein the firmware of the second MCU can be changed.

7. The memory device according to claim 1 wherein the second MCU is further configured to store data related to the DAC value in a temporary register.

8. A control method of a memory device, the method comprising:
a first microcontroller executing instructions stored in firmware to generate a plurality of digital analog converter (DAC) computation parameters and store the DAC computation parameters in a load register, and
a second microcontroller executing instructions stored in firmware to receive the DAC computation parameters from the load register, executing a DAC computation to generate a DAC value, and transmit the DAC value to a plurality of charge pumps and voltage regulators.

9. The control method of claim 8, further comprising the first microcontroller:
receiving a command and an address from an external device,
receiving an instruction from a read-only memory (ROM), and
executing the instruction received from the ROM.

10. The control method of claim 8, further comprising:
the second microcontroller obtaining data from the load register and adding the data to a temporary register.

11. The control method of claim 8 further including the step of changing the firmware of the first microcontroller or of the second microcontroller.

* * * * *